US006985099B1

(12) United States Patent
Luz et al.

(10) Patent No.: US 6,985,099 B1
(45) Date of Patent: Jan. 10, 2006

(54) AUTOMATIC GAIN CONTROL WITH DIGITAL FILTERING FOR RADIO-FREQUENCY COMMUNICATIONS SYSTEMS

(75) Inventors: Yuda Yehuda Luz, Buffalo Grove, IL (US); Ron Rotstein, Buffalo Grove, IL (US); Gregory Agami, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 830 days.

(21) Appl. No.: 09/693,799

(22) Filed: Oct. 20, 2000

(51) Int. Cl.
*H03M 1/18* (2006.01)

(52) U.S. Cl. .................................. 341/139; 455/232.1
(58) Field of Classification Search ................ 705/14; 375/147, 345; 370/206, 209; 341/139; 455/138, 455/232.1–250.1
See application file for complete search history.

(56) References Cited

U.S. PATENT DOCUMENTS

| | | | | | |
|---|---|---|---|---|---|
| 4,701,934 A | * | 10/1987 | Jasper | ......................... | 375/147 |
| 5,103,459 A | * | 4/1992 | Gilhousen et al. | .......... | 370/206 |
| 5,422,909 A | * | 6/1995 | Love et al. | .................. | 375/147 |
| 5,459,432 A | * | 10/1995 | White et al. | ................. | 329/307 |
| 5,710,990 A | * | 1/1998 | Long et al. | .................. | 455/103 |
| 5,764,104 A | * | 6/1998 | Luz | ......................... | 330/124 R |
| 6,002,925 A | * | 12/1999 | Vu et al. | ..................... | 455/313 |
| 6,321,073 B1 | * | 11/2001 | Luz et al. | ................. | 455/239.1 |
| 6,603,745 B1 | * | 8/2003 | Antonio et al. | ............. | 370/318 |
| 6,654,594 B1 | * | 11/2003 | Hughes et al. | ........... | 455/245.1 |

OTHER PUBLICATIONS

Crochiere et al. Interpolation and Decimation of Digital Signals—A Tutorial Review, IEEE, original publication: Proceedings IEEE vol. 69, pp. 300-331, Mar. 1981; reprinted IEEE Press 1992 Oversampling Delta-Sigma Data Converters, editors Candy, J.C. & Temes, G. pp. 417-448.*

* cited by examiner

Primary Examiner—Howard L. Williams
(74) Attorney, Agent, or Firm—Steven A. May

(57) ABSTRACT

An automatic gain control includes a digital lowpass filter for filtering a series of digital samples generated by an analog-to-digital converter to generate a lowpass filtered digital sample series; a power averager coupled to the digital lowpass filter for calculating an average power of the lowpass filtered digital sample series; and a lookup table coupled to the power averager for setting a selectable gain of an amplifier coupled to the analog-to-digital converter as a function of the average power.

15 Claims, 3 Drawing Sheets

AUTOMATIC GAIN CONTROL WITH DIGITAL FILTERING FOR RADIO-FREQUENCY COMMUNICATIONS SYSTEMS

BACKGROUND OF THE INVENTION

The present invention relates generally to automatic gain control (AGC) for use in radio-frequency (RF) communications systems. More specifically, but without limitation thereto, the present invention relates to an automatic gain control with digital filtering for mitigating dynamic range reduction due to out-of-band interference.

Typical radio frequency communications signals are divided into a number of channels within a signal band centered around a carrier frequency. For example, 10 channels each 5 megahertz (MHz) wide can fit into a 50 MHz wide frequency band centered at a carrier frequency of, for example, 2 gigahertz (GHz). About 99% of the signal in each channel is contained in a band of frequencies about 4.4 MHz wide, ordinarily leaving a gap between adjacent channels to avoid mutual interference. During transmission of the signal, however, signal from one channel may cross over into other channels (or bands) causing out-of-band interference. Much time, effort, and ingenuity has been devoted to the problem of filtering out this out-of-band interference.

One of the difficulties encountered in signal filtering is that radio frequency signals in the gigahertz range are much more difficult to filter than signals at lower frequencies. One approach to solving this filtering problem is to translate the radio frequency signal to an intermediate frequency (IF) signal. For example, if a 5 MHz channel is transmitted on a carrier in the gigahertz range from 1.995 GHz to 2.000 GHz, the carrier may be translated to an intermediate frequency at some lower frequency, for example, 700 MHz. The 5 MHZ channel would then occupy from 695 MHz to 700 MHz. At this lower frequency, filtering is relatively straightforward.

Analog filters in the radio frequency, intermediate frequency, and baseband ranges are typically used to mitigate out-of-band interference. Disadvantageously, analog filters can be expensive, especially for the higher frequencies.

BRIEF DESCRIPTION OF THE DRAWINGS

The above and other aspects, features and advantages of the present invention will be more apparent from the following more specific description thereof, presented in conjunction with the following drawings wherein.

Corresponding reference characters indicate corresponding components throughout the several views of the drawings.

DETAILED DESCRIPTION OF THE DRAWINGS

The present invention advantageously addresses the needs above as well as other needs by providing a method and apparatus for digitally filtered automatic gain control.

In one embodiment, the invention may be characterized as an automatic gain control that includes a digital lowpass filter for filtering a series of digital samples generated by an analog-to-digital converter to generate a lowpass filtered digital sample series; a power averager coupled to the digital lowpass filter for calculating an average power of the lowpass filtered digital sample series; and a lookup table coupled to the power averager for setting the selectable gain of an amplifier coupled to the analog-to-digital converter as a function of the average power.

Figure 1:
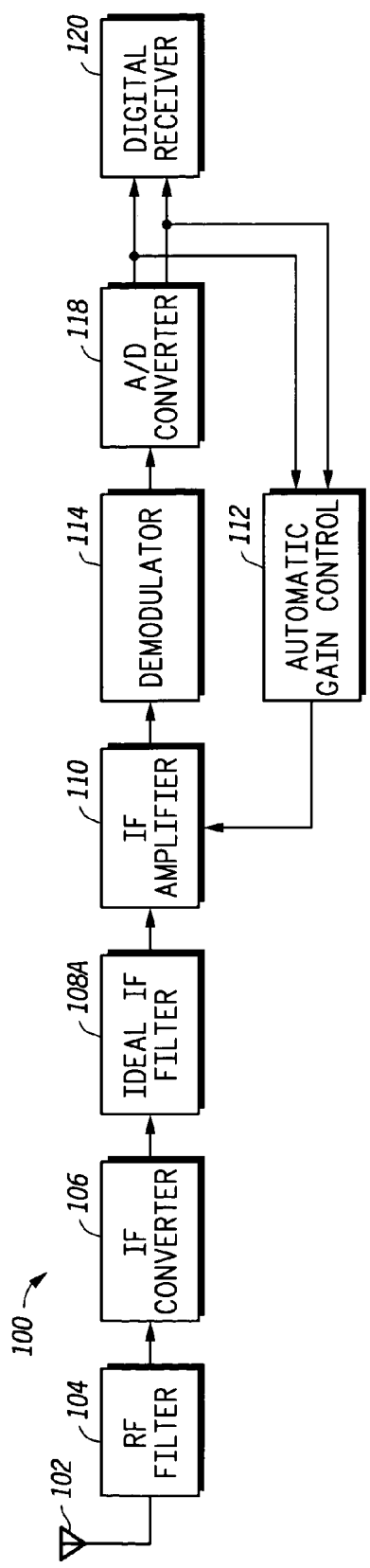
FIG. 1 is a block diagram of a typical radio frequency communications receiver using a conventional automatic gain control.

FIG. 1 is a block diagram of a typical radio frequency communications receiver 100 using a conventional automatic gain control (AGC). Shown are an antenna 102, a radio frequency filter circuit 104, an intermediate frequency converter 106, an intermediate frequency (IF) filter 108A, herein provided as an "ideal" IF filter, an intermediate frequency amplifier 110, an automatic gain control (AGC) circuit 112, a demodulator 114, an analog-to-digital (A/D) converter 118, and a digital receiver 120.

The antenna 102 receives as input a radio frequency signal containing the signal channels. The radio frequency signal may be transmitted from any source of radio frequency signals, for example, a satellite antenna. The radio frequency filter 104 removes a portion of out-of-band interference from the received radio frequency signal. The intermediate frequency converter 106 converts or translates the relatively high frequency radio frequency signal to a more readily filtered, lower intermediate frequency signal. The intermediate frequency filter 108A removes harmonics from the intermediate frequency converter 106 and more of the out-of-band interference from the intermediate frequency signal. The intermediate frequency amplifier 110 amplifies the filtered intermediate frequency signal. The demodulator 114 translates the amplified intermediate frequency signal to a complex baseband signal. The complex baseband signal is illustrated by double lines, one for the in-phase or real component, and the other for the quadrature-phase or imaginary component.

The analog-to-digital converter 118 samples the complex baseband signal at a rate greater than the Nyquist rate to avoid aliasing and converts the complex baseband signal to complex digital samples, i.e., two separate series of digital samples that are representative of the real (in-phase) and imaginary (quadrature-phase) components of the communications signal respectively. The two series of digital samples output by the analog-to-digital converter 118 are then received as input by the digital receiver 120.

The conventional automatic gain control circuit 112 estimates the power of the communications signal from the digital samples and periodically adjusts the gain of the intermediate frequency amplifier 110 so that the amplified intermediate frequency signal is scaled to the dynamic range of the analog-to-digital converter 118. The purpose of scaling the intermediate frequency signal to the dynamic range of the analog-to-digital converter 118 is to maximize the signal-to-noise ratio at the input of the digital receiver 120. A disadvantage of this approach is that out-of-band interference, if not adequately mitigated by the analog filters 104, 108, and 116, may reduce the available gain of the intermediate frequency amplifier 110. The available gain of the intermediate frequency amplifier 110 is reduced when the out-of-band interference generates peak amplitudes that must be accommodated by the dynamic range of the analog-to-digital converter to avoid clipping, leaving fewer bits of dynamic range for the communications signal. The reduced gain of the intermediate frequency amplifier 110 reduces the dynamic range of the communications signal at the analog-to-digital converter 118 and correspondingly the signal-to-noise ratio (SNR) at the input of the digital receiver 120. Out-of-band interference is especially common in multiple access systems because adjacent frequency bands are used concurrently. A solution to the problem of out-of-band interference is to improve the analog filters, but high-performance analog filters may be prohibitively expensive.

Figure 2:
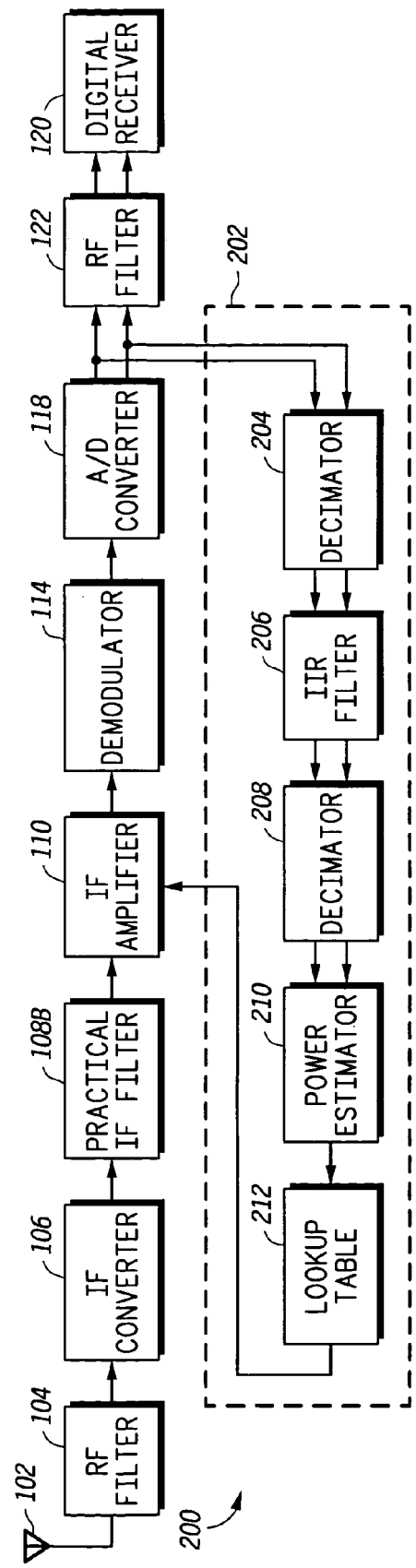
FIG. 2 is a block diagram of a radio frequency communications receiver using digitally filtered automatic gain control according to an embodiment of the present invention.

FIG. 2 is a block diagram of a radio frequency communications receiver 200 using digitally filtered automatic gain control. By introducing digital filtering into the automatic gain control, the requirements for the analog filters may be relaxed, substantially lowering the cost of the radio frequency communications receiver 200. Alternatively, the out-of-band interference may be further reduced for the same analog filters, further increasing the signal-to-noise ratio at the digital receiver 120.

Shown in FIG. 2 are an antenna 102, a radio frequency filter circuit 104, an intermediate frequency converter 106, an intermediate frequency (IF) filter 108B, herein a "practical" IF filter embodiment, an intermediate frequency amplifier 110, a filtered automatic gain control 202, a demodulator 114, an analog-to-digital (A/D) converter 118, a digital receiver 120, and a finite impulse response lowpass filter 122.

The automatic gain control 202 includes a first decimator 204, a digital infinite impulse response filter 206, a second decimator 208, an average power estimator 210, and a gain look-up table 212.

In operation, the radio frequency communications receiver 200 is similar to that of FIG. 1 except as follows. The analog-to-digital converter 118 samples the filtered complex baseband signal to provide an adequate sampling output for the digital finite impulse response filter 122 at a sampling rate of, for example, four times the Nyquist sampling rate. The analog-to-digital converter 118 digitizes the complex baseband signal to a series of complex digital samples, i.e., two separate series of digital samples that are representative of the real (in-phase) and imaginary (quadrature-phase) components of the communications signal respectively. The two series of digital samples output by the analog-to-digital converter 118 are then received as input by the digital finite impulse response lowpass filter 122. The digital finite impulse response lowpass filter 122 further removes out-of-band interference and outputs a digital output signal to the digital receiver 120. The digital finite impulse response lowpass filter 122 and the digital receiver 120 may be implemented in hardware or software according to well known techniques.

The filtered automatic gain control 202 receives as input the two series of digital samples from the analog-to-digital converter 118. Assuming that the front-end analog filters have sufficiently removed interference at frequencies higher than the Nyquist rate, the two series of digital samples may be decimated by a factor of two by the first decimator 204 without risk of aliasing. By reducing the sample rate by half, the first decimator 204 relaxes the performance required of the digital infinite impulse response filter 206.

The digital infinite impulse response filter 206 attenuates out-of-band interference between half the Nyquist rate and the Nyquist rate from the decimated digital samples output by the first decimator 204. The digital infinite impulse response filter 206 in this example has the desirable characteristics of simple implementation and minimal delay, however other types of filters may be used to remove frequencies between half the Nyquist rate and the Nyquist rate to suit specific applications.

The second decimator 208 again reduces the sample rate by half to relax the performance requirements of the average power estimator 210. The average power estimator calculates an average power estimate as a running average of the signal power, for example, by calculating a sum of the squares of the two series of digital samples received from the second decimator 208. The average power estimate is generated as output to the lookup table 212.

The lookup table 212 contains amplifier gain coefficients for each average power estimate. The amplifier gain coefficients are precalculated as a function of the average power estimate, for example, the scalar factor between each average power estimate and the desired average output power within the dynamic range of the analog-to-digital converter 118. Each amplifier gain coefficient adjusts the gain of the intermediate frequency amplifier 110 to minimize the difference between the corresponding average power estimate and the desired average output power within the dynamic range of the analog-to-digital converter 118, thereby maintaining the average power of the amplified intermediate frequency signal at the full usable dynamic range of the analog-to-digital converter 118. Because interference signal power may be higher than the communications signal power, some of the higher order bits of the analog-to-digital converter 118, for example, the two most significant bits, are reserved as headroom to avoid overflow or clipping of the communications signal. Some of the lower order bits of the analog-to-digital converter 118, for example, the two least significant bits, are used for precision in the digital infinite impulse response filter 206. The remaining bits of the analog-to-digital converter 118, for example, the middle four bits, are extracted by the digital finite impulse response lowpass filter 122 to filter the baseband signal for the digital receiver 120. In this example, an eight-bit analog-to-digital converter may be used for the analog-to-digital converter 118.

Figure 3:
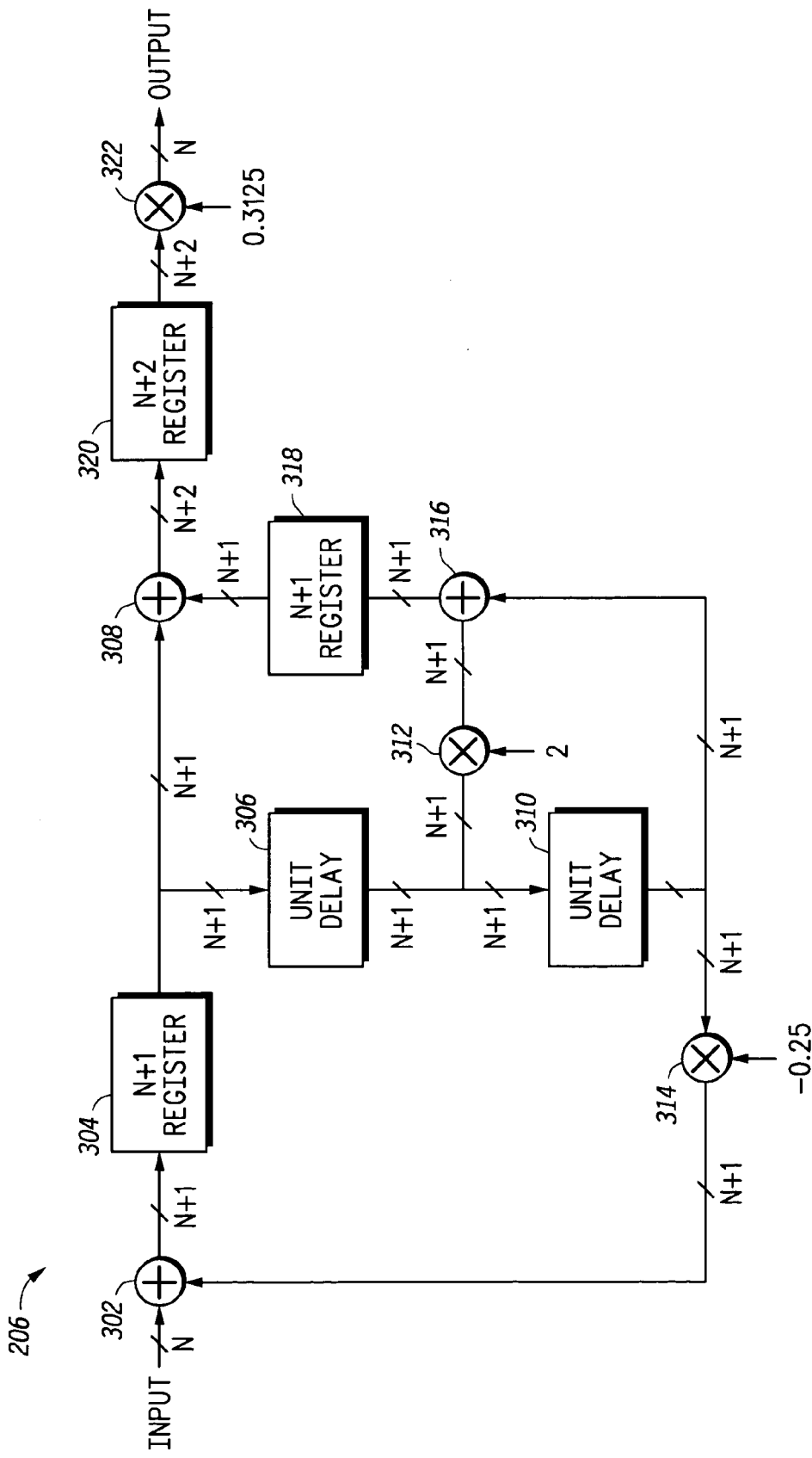
FIG. 3 is a block diagram of an infinite impulse response filter for the automatic gain control of FIG. 2.

FIG. 3 is a block diagram of an infinite impulse response filter 206 for the automatic gain control of FIG. 2 that can provide 20 dB attenuation between 0.8 of the Nyquist rate and 1.0 of the Nyquist rate. Identical infinite impulse response filters 206 may be used for each of the two series of digital samples. While the digital finite impulse response lowpass filter 122 is used for baseband filtering at the digital receiver 120 because of its low phase and magnitude distortion in the filtered digital baseband, the digital infinite impulse response lowpass filter 206 is a preferred choice for the filtered automatic gain control 202 because it is simple to implement and incurs minimal time delay in the signal. Also, the relatively greater phase distortion of an infinite impulse response (IIR) filter compared to a finite impulse response filter do not adversely affect the calculation of the average power by the average power estimator 210.

By way of example, for code division multiple access (CDMA) applications requiring compliance with the CDMA2000 standard in which each channel has, for example, a bandwidth of 3.6864 MHz, the infinite impulse response filter 206 may be described by the following transfer function:

$$H(z) = \frac{0.3125(1+z^{-1})^2}{(1+0.5jz^{-1})(1-0.5jz^{-1})} \quad (1)$$

The transfer function (1) may be implemented in either hardware or software as shown in FIG. 3 by a first sum function 302, a first sum register 304, a first unit delay 306, a third sum function 308, a second unit delay 310, a first multiplier 312, a second multiplier 314, a second sum function 316, a second sum register 318, a third sum register 320, and a third multiplier 322.

In operation, the output of the first decimator 204 is received as an N-bit wide input and summed by the first sum function 302. The output of the sum function 302 is stored in the first sum register 304. The first sum register 304 is N+1 bits wide, which is one bit wider than the output of the analog-to-digital converter 118, to accommodate the output of the first sum function 302.

The output of the first sum register 304 is delayed one sample period by the first unit delay 306 to generate a first delayed sum.

The first delayed sum output from the first unit delay 306 is multiplied by two by the first multiplier 312 and is delayed one sample period by the second unit delay 310 to generate a second delayed sum. The second delayed sum is multiplied by −0.25 by the second multiplier 314. The output of the second multiplier 314 is summed by the first sum function 302. The second delayed sum and the output of the first multiplier 312 are summed by the second sum function 316.

The output of the second sum function 316 is stored in the second sum register 318. The second sum register 318 is one bit wider than the output of the analog-to-digital converter 118 to accommodate the output of the second sum function 316. The output of the second sum register 318 and the output of the first sum register 304 are summed by the third sum function 308. The output of the third sum function 308 is stored in the third sum register 320. The third sum register 320 is two bits wider than the output of the analog-to-digital converter 118 to accommodate the output of the third sum function 308.

The output of the third sum register 320 is multiplied by 0.3125 by the third multiplier 322 to normalize the output of the third multiplier 322 to the digital sample series received as input by the first sum function 302. The output of the third multiplier 322 has the same number of bits N as the analog-to-digital converter 118 and is the lowpass filtered output of the infinite impulse response lowpass filter 206.

Figure 4:
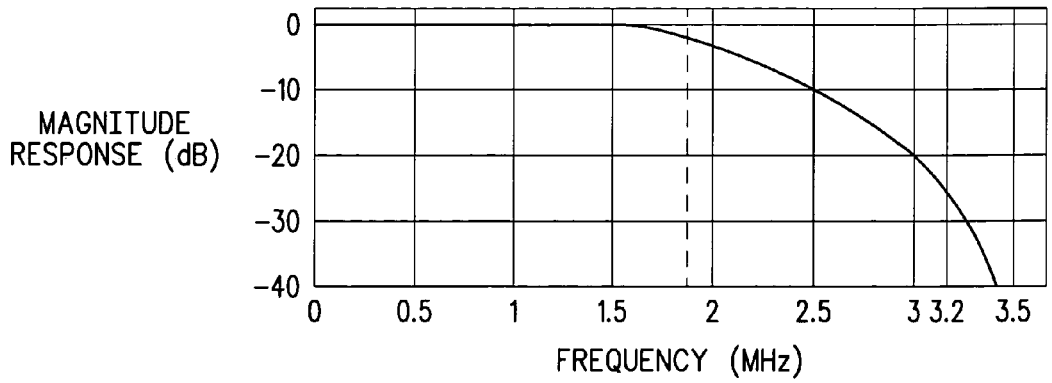
FIG. 4 is a graph of the magnitude response versus frequency of the infinite impulse response filter of FIG. 3.
Figure 5:
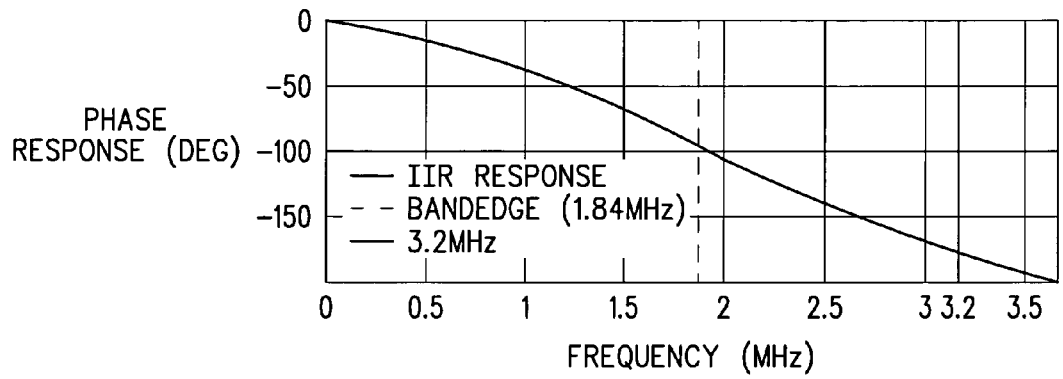
FIG. 5 is a graph of the phase response versus frequency of the infinite impulse response filter of FIG. 3.
Figure 6:
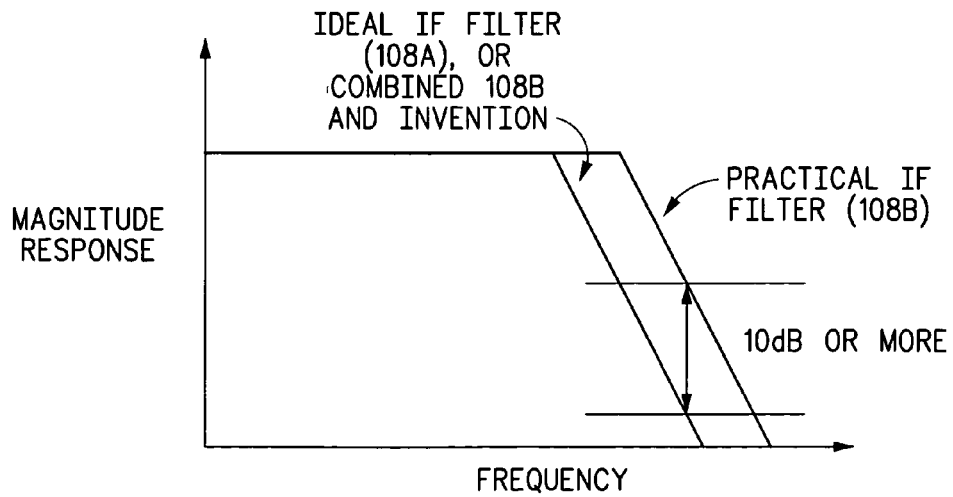
FIG. 6 illustrates frequency response comparisons as between an "deal" IF filter and a "practical" IF filter.

FIGS. 4 and 5 are graphs of the magnitude response and phase response versus frequency, respectively, of the infinite impulse response filter 206 shown in FIG. 3. Truncation effects at the output of the third multiplier 322 from normalizing the output to the input without rounding off the least significant bit are minimal when applied to an AGC circuit. Accordingly, FIG. 6 is a graph showing the frequency response comparisons as between the "ideal" IF filter 108A of FIG. 1 and that of the "practical" IF filter 108B frequency response of FIG. 2. A magnitude response of 10 dB or more is illustrated.

For a channel having a bandwidth of 3.68 MHz (i.e.; centered at zero extending to band edges at −1.84 MHz and +1.84 MHz) attenuation at the band edge (1.84 MHz) is 1.5 dB, while at 3.2 MHz attenuation is 26.5 dB. Because the filter passband is not entirely flat, the 8-bit output power is 0.046 dB above the unfiltered power for a code division multiple access (CDMA) signal. The lookup table 212 can be modified accordingly to compensate for this discrepancy.

Other modifications, variations, and arrangements of the present invention may be made in accordance with the above teachings other than as specifically described to practice the invention within the spirit and scope defined by the following claims.

What is claimed is:

1. An automatic gain control loop having a feedback circuit comprising:
    a digital lowpass filter for filtering a series of digital samples generated by an analog-to-digital converter to generate a lowpass filtered digital sample series;
    a power averager coupled to the digital lowpass filter for calculating an average power of the lowpass filtered digital sample series; and
    a lookup table coupled to the power averager for setting a selectable gain of an amplifier coupled to the analog-to-digital converter as a function of the average power.

2. The automatic gain control loop of claim 1 wherein the digital lowpass filter is an infinite impulse response digital lowpass filter.

3. The automatic gain control loop of claim 2 wherein the infinite impulse response digital lowpass filter comprises:
    a first sum function for receiving as input a series of digital samples and for generating a first sum;
    a first sum register coupled to the first sum function for storing the first sum;
    a first unit delay coupled to the first sum register for delaying the first sum by one sample period to generate a first delayed sum;
    a second unit delay coupled to the first unit delay for delaying the first sum by two sample periods to generate a second delayed sum;
    a first multiplier coupled to the first unit delay for multiplying the first delayed sum by two;
    a second multiplier coupled to the second unit delay for multiplying the second delayed sum by a first constant;
    a second sum function coupled to the second unit delay and the first multiplier for generating a second sum;
    a second sum register coupled to the second sum function for storing the second sum;
    a third sum function coupled to the first sum register and the second sum register for generating a third sum;
    a third sum register coupled to the third sum function for storing the third sum; and
    a third multiplier coupled to the third sum register for multiplying the third sum by a second constant to generate a normalized lowpass filtered output.

4. The automatic gain control loop of claim 1 wherein the lowpass filter attenuates frequencies between half Nyquist rate and Nyquist rate.

5. The automatic gain control loop of claim 1 wherein the lookup table sets the selectable gain of the amplifier so that the amplified signal has constant average power within the dynamic range of the analog-to-digital converter.

6. An automatic gain control loop having a feedback circuit comprising:
    a first decimator for generating a first decimated digital sample series from a series of digital samples generated by an analog-to-digital converter;
    an infinite impulse response digital lowpass filter coupled to the first decimator for filtering the first decimated digital sample series to generate a filtered digital sample series;

a second decimator coupled to the infinite impulse digital lowpass filter for generating a second decimated digital sample series from the filtered digital sample series;

a power averager coupled to the second decimator for calculating an average power of the second decimated sample series; and a lookup table coupled to the power averager for setting a selectable gain of an intermediate frequency amplifier coupled to the analog-to-digital converter as a function of the average power.

7. A method for automatic gain control comprising the following steps:

amplifying, by an amplifier, a communications signal according to a selectable gain to generate an amplified communications signal;

digitizing the amplified communications signal to produce a feedback signal comprising a series of digital samples representative of the amplified communications signal;

lowpass filtering the feedback signal to generate a lowpass filtered digital sample series;

calculating an average power of the lowpass filtered digital sample series; and setting the selectable gain of the amplifier as a function of the average power.

8. The method of claim 7 wherein the step of lowpass filtering includes lowpass filtering by an infinite impulse response digital lowpass filter.

9. The method of claim 8 wherein the infinite impulse response digital lowpass filter comprises:

a first sum function for receiving as input a series of digital samples and for generating a first sum;

a first sum register coupled to the first sum function for storing the first sum;

a first unit delay coupled to the first sum register for delaying the first sum by one sample period to generate a first delayed sum;

a second unit delay coupled to the first unit delay for delaying the first sum by two sample periods to generate a second delayed sum;

a first multiplier coupled to the first unit delay for multiplying the first delayed sum by two;

a second multiplier coupled to the second unit delay for multiplying the second delayed sum by a first constant;

a second sum function coupled to the second unit delay and the first multiplier for generating a second sum;

a second sum register coupled to the second sum function for storing the second sum;

a third sum function coupled to the first sum register and the second sum register for generating a third sum;

a third sum register coupled to the third sum function for storing the third sum; and a third multiplier coupled to the third sum register for multiplying the third sum by a second constant to generate a normalized lowpass filtered output.

10. The method of claim 7 wherein the step of lowpass filtering attenuates frequencies between half Nyquist rate and Nyquist rate.

11. The method of claim 7 wherein the step of setting the selectable gain includes setting the gain of the amplifier so that the amplified signal has constant average power within the dynamic range of the series of digital samples.

12. The method of claim 7 wherein the step of digitizing includes sampling the amplified communications signal at a sample rate of at least two times Nyquist rate.

13. The method of claim 7 wherein the step of digitizing includes sampling the amplified communications signal at a sample rate of at least four times Nyquist rate.

14. The method of claim 7 further comprising the step of decimating the series of digital samples before the step of lowpass filtering.

15. The method of claim 7 further comprising the step of decimating the lowpass filtered digital sample series before the step of calculating an average power.

* * * * *